(12) United States Patent
Sohn

(10) Patent No.: US 7,915,930 B2
(45) Date of Patent: Mar. 29, 2011

(54) DUAL POWER-UP SIGNAL GENERATOR FOR STABILIZING AN INTERNAL VOLTAGE GENERATOR

(75) Inventor: Young Chul Sohn, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 44 days.

(21) Appl. No.: 12/215,791

(22) Filed: Jun. 30, 2008

(65) Prior Publication Data

US 2009/0237130 A1    Sep. 24, 2009

(30) Foreign Application Priority Data

Mar. 18, 2008 (KR) .......................... 10-2008-0024983

(51) Int. Cl.
*H03L 7/00* (2006.01)
(52) U.S. Cl. ..................... 327/143; 327/142; 327/198
(58) Field of Classification Search .......... 327/142, 327/143, 198
See application file for complete search history.

(56) References Cited

U.S. PATENT DOCUMENTS

| 6,914,462 | B2 * | 7/2005 | Kim et al. ............. 327/143 |
| 6,961,270 | B2 * | 11/2005 | Do ..................... 365/189.09 |
| 7,123,062 | B2 | 10/2006 | Do |
| 7,564,279 | B2 * | 7/2009 | Tang et al. ............ 327/143 |
| 2005/0140405 | A1 * | 6/2005 | Do et al. .............. 327/143 |

FOREIGN PATENT DOCUMENTS

| KR | 10-2001-0063500 A | 7/2001 |
| KR | 10-2003-0089878 A | 11/2003 |

* cited by examiner

*Primary Examiner* — Lincoln Donovan
*Assistant Examiner* — John W Poos
(74) *Attorney, Agent, or Firm* — John P. White; Cooper & Dunham LLP

(57) ABSTRACT

A dual power-up signal generator includes a power-up signal generator which generates a first power-up signal by using a first voltage signal obtained by detecting a level of a power supply voltage, and generates a second power-up signal by using a second voltage signal obtained by detecting the level of the power supply voltage.

11 Claims, 4 Drawing Sheets

DUAL POWER-UP SIGNAL GENERATOR FOR STABILIZING AN INTERNAL VOLTAGE GENERATOR

TECHNICAL FIELD

This disclosure relates to a semiconductor memory and, more particularly, to a power-up signal generator.

BACKGROUND

Generally, a power-up signal is used in a semiconductor memory to determine if the level of a power supply voltage VDD reaches a voltage level required for the normal operation of the semiconductor memory when the power supply voltage VDD is applied to the semiconductor memory in an initial stage of the operation thereof.

The power-up signal is necessary because the semiconductor memory may abnormally operate when power is applied to the semiconductor memory before the level of the power supply voltage reaches the voltage level for the normal operation of the semiconductor memory. At this time, if the power-up signal is activated, the power-up signal may become a high level or a low level. In the following description, it is assumed that the power-up signal is a high level.

Accordingly, the semiconductor memory essentially includes a power-up generator that generates a power-up signal activated according to the level of the power supply voltage.

FIG. 1 is a graph for explaining a power-up signal according to the conventional technology.

As shown in FIG. 1, the power-up signal rises corresponding to the level of the power supply voltage VDD when the power supply voltage VDD is applied to the semiconductor memory in an initial stage of the operation thereof. Thereafter, if the level of the power supply voltage VDD exceeds a predetermined voltage level, the power-up signal is low.

Such a power-up signal shorts an internal voltage to the power supply voltage VDD, and resets registers of a logic module for the duration in which the power-up signal PWRUP is high. At this time, if the power-up signal PWRUP is set to a low level, internal voltages are generated from their respective internal voltage drivers, and the logic module becomes a stand-by state, such that the logic module can always be operated.

However, if the power-up signal PWRUP becomes a high level in the lowest level of the power supply voltage VDD due to the requirement for low power supply voltage in a mobile product, registers in all logic modules are reset, so that the level of the power supply voltage VDD of an internal voltage supplying circuit cannot but descend.

Due to such a problem, a driver for an internal voltage must maintain a target voltage level in a low power supply voltage. In other words, since the internal voltage must be applied in the low power supply voltage as soon as the power-up operation is completed, the internal voltage is unstable, so that fatal errors may occur.

BRIEF SUMMARY

In an aspect of this disclosure, a dual power-up signal generator is provided that is capable of stabilizing an internal voltage generator in a mobile product that requires a low power supply voltage.

In an embodiment, a dual power-up signal generator includes a power-up signal generator which generates a first power-up signal by using a first voltage signal obtained by detecting a level of a power supply voltage, and generates a second power-up signal by using a second voltage signal obtained by detecting the level of the power supply voltage.

The first power-up signal can be used to reset a register of a logic module of a semiconductor memory, and the second power-up signal can be used to control an internal voltage driver.

The power-up signal generator can include a power supply voltage level detector which outputs the first and second voltage signals obtained by detecting the level of the power supply voltage, and a power-up signal driver which outputs the first and second power-up signals activated according to the voltage levels of the first and second voltage signals.

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION OF PREFERRED EMBODIMENTS

Hereinafter, examples and exemplary embodiments of the present invention will be described with reference to accompanying drawings. However, the examples and embodiments are for illustrative purposes only and are not intend to limit the scope of the invention.

Figure 1:
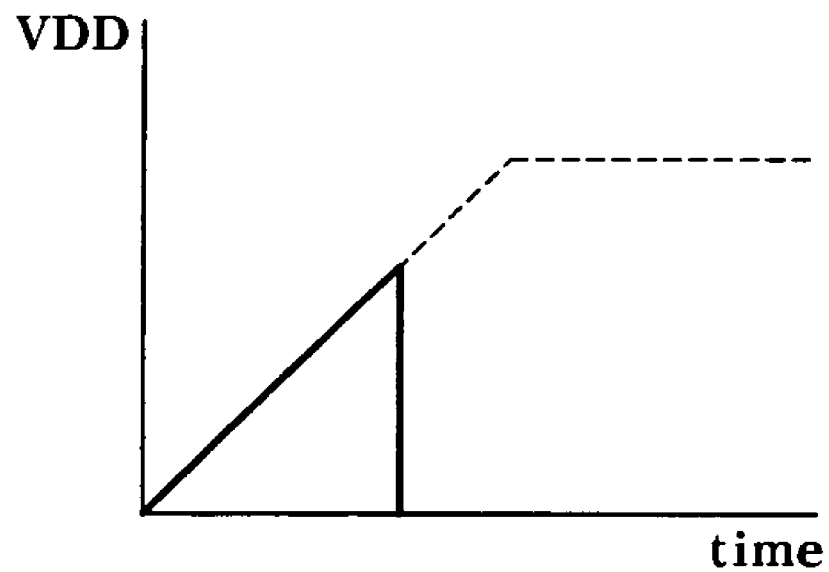
FIG. 1 is a graph for explaining a power-up signal according to the conventional technology.
Figure 2:
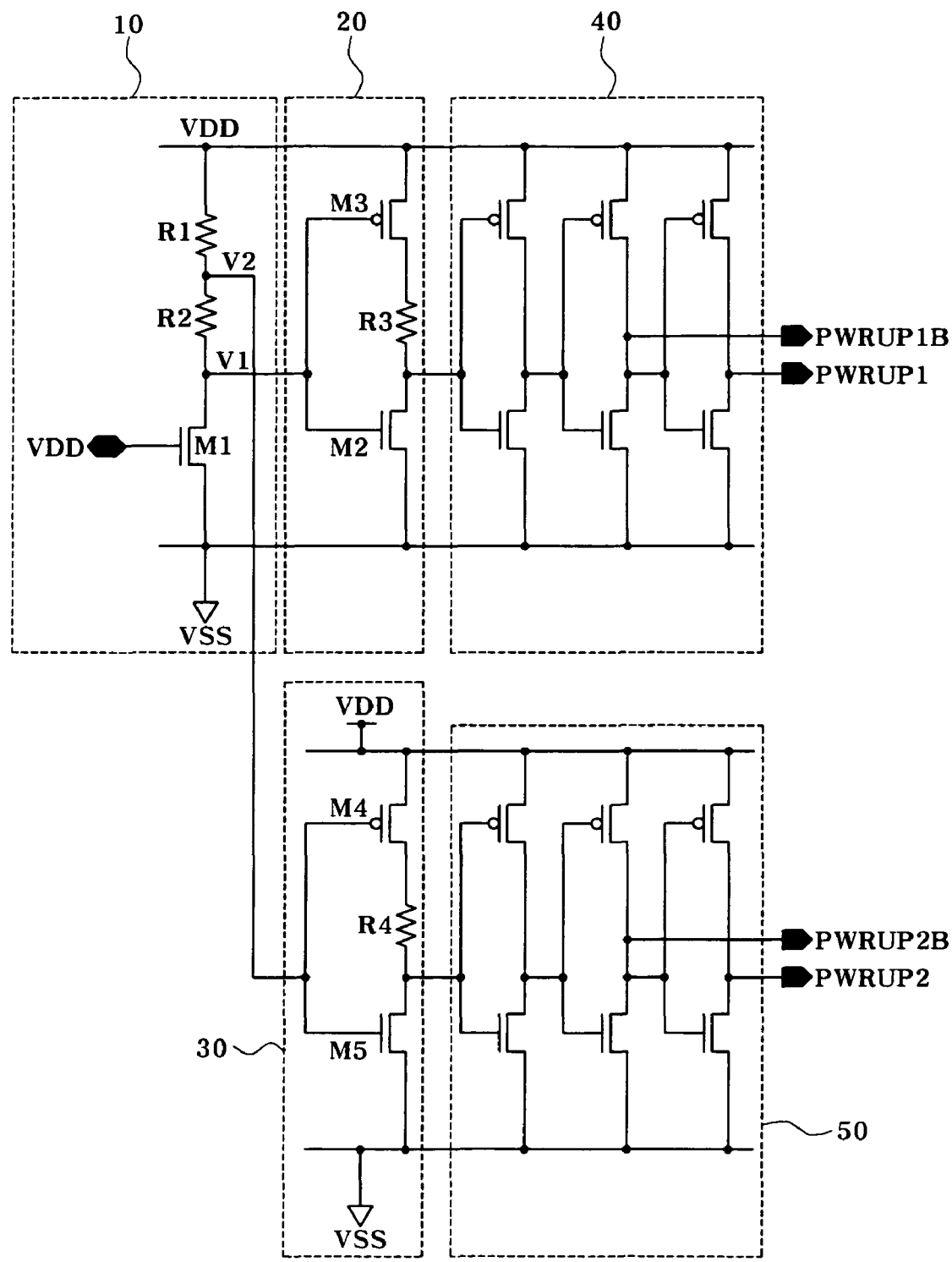
FIG. 2 is a circuit diagram showing a dual power-up signal generator according to an embodiment of the present invention.

FIG. 2 is a circuit diagram showing a dual power-up signal generator according to an embodiment of the present invention.

In the embodiment shown in FIG. 2, the dual power-up signal generator includes a power supply voltage level detector 10, which outputs first and second voltage signals V1 and V2 obtained by detecting the level of a power supply voltage VDD supplied to a semiconductor memory, a first power-up signal driver 20, which outputs first power-up signals PWRUP1 and PWRUP1B activated according to the level of the first voltage signal V1, and a second power signal driver 30, which outputs second power-up signals PWRUP2 and PWRUP2B activated according to the level of the second voltage signal V2.

The power supply voltage level detector 10 includes a resistor array R1 and R2, which divides the power supply voltage VDD to output a second voltage signal V2, and a first NMOS transistor M1 which is connected between the resistor array R1 and R2 and a grounding voltage VSS to output the first voltage signal V1 in response to the power supply voltage VDD.

The first power-up signal driver 20 includes a first pull-up driver M3 pull-up driven in response to the first voltage signal V1, a first resistor R3 connected in series to the first pull-up driver M3, a first pull-down driver M2 connected in series to the first resistor R3 and pull-down driven in response to the first voltage signal V1, and a first buffer unit 40 that buffers the output signal of the first power-up signal driver 20.

The second power-up signal driver 30 includes a second pull-up driver M4 pull-up driven in response to the second voltage signal V2, a second resistor R4 connected in series to the second pull-up driver M4, a second pull down driver M5 pull-down driven in response to the second voltage signal V2, and a second buffer module that buffers the output signal of the second power-up signal driver 30.

The first power-up signal PWRUP1 resets a resistor of a logic module in a semiconductor memory in order to perform initial setting when the semiconductor memory is powered up. The second power-up signal PWRUP2 is used to control an internal voltage driver.

Hereinafter, operation of the dual power-up signal generator of FIG. 2 will be described in detail with reference to accompanying drawings.

As shown in FIG. 2, the power supply voltage level detector 10 outputs the first voltage signal V1 and the second voltage signal V2 obtained by dividing the power supply voltage VDD according to a resistance ratio between the first NMOS transistor M1 and the resistor array R1 and R2, in which the first NMOS transistor M1 is connected in series to the resistor array R1 and R2 between the power supply voltage VDD and a ground voltage VSS.

In this case, the second voltage signal V2 has a voltage level higher than that of the first voltage signal V1 by a ratio corresponding to the resistor R2.

Thus, the first power-up signal driver 20 outputs the first power-up signal PWRUP1 activated according to a voltage level of the first voltage signal V1, and the second power-up signal driver 30 outputs the second power-up signal PWRUP2 activated according to a voltage level of the second voltage signal V2.

Figure 3:
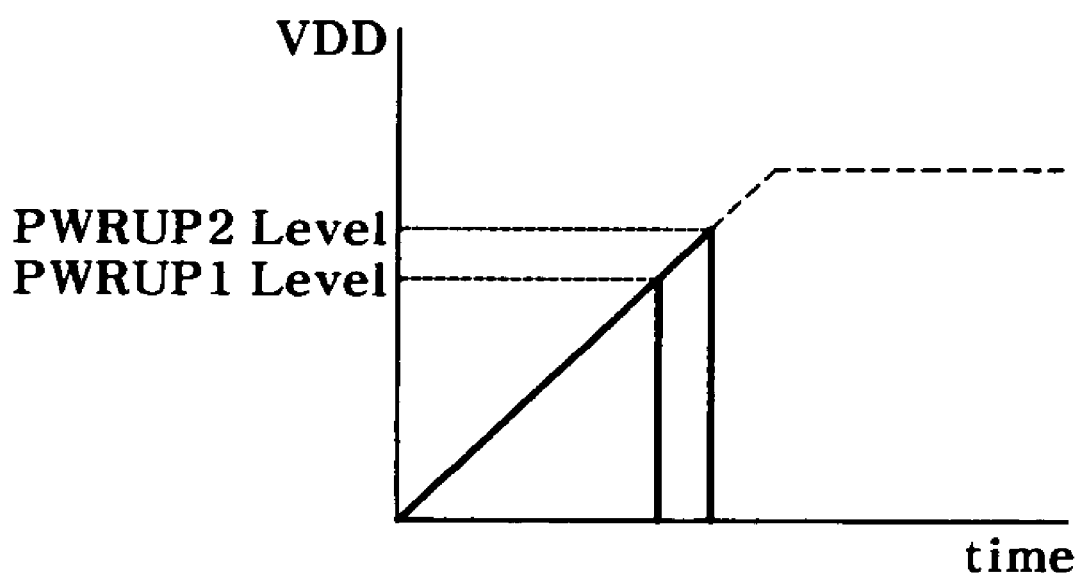
FIG. 3 is a graph for explaining operation of the dual power-up signal generator of FIG. 3.

Accordingly, as shown in FIG. 3, the second power-up signal PWRUP 2 is low in a at level higher than that of the first power-up signal PWRUP 1. In other words, since the internal voltage generator, which generates internal voltage in response to the second power-up signal PWRUP2, operates when the voltage level of the power supply voltage VDD sufficiently rises, the internal voltage generator can stably drive internal voltage.

Figure 4:
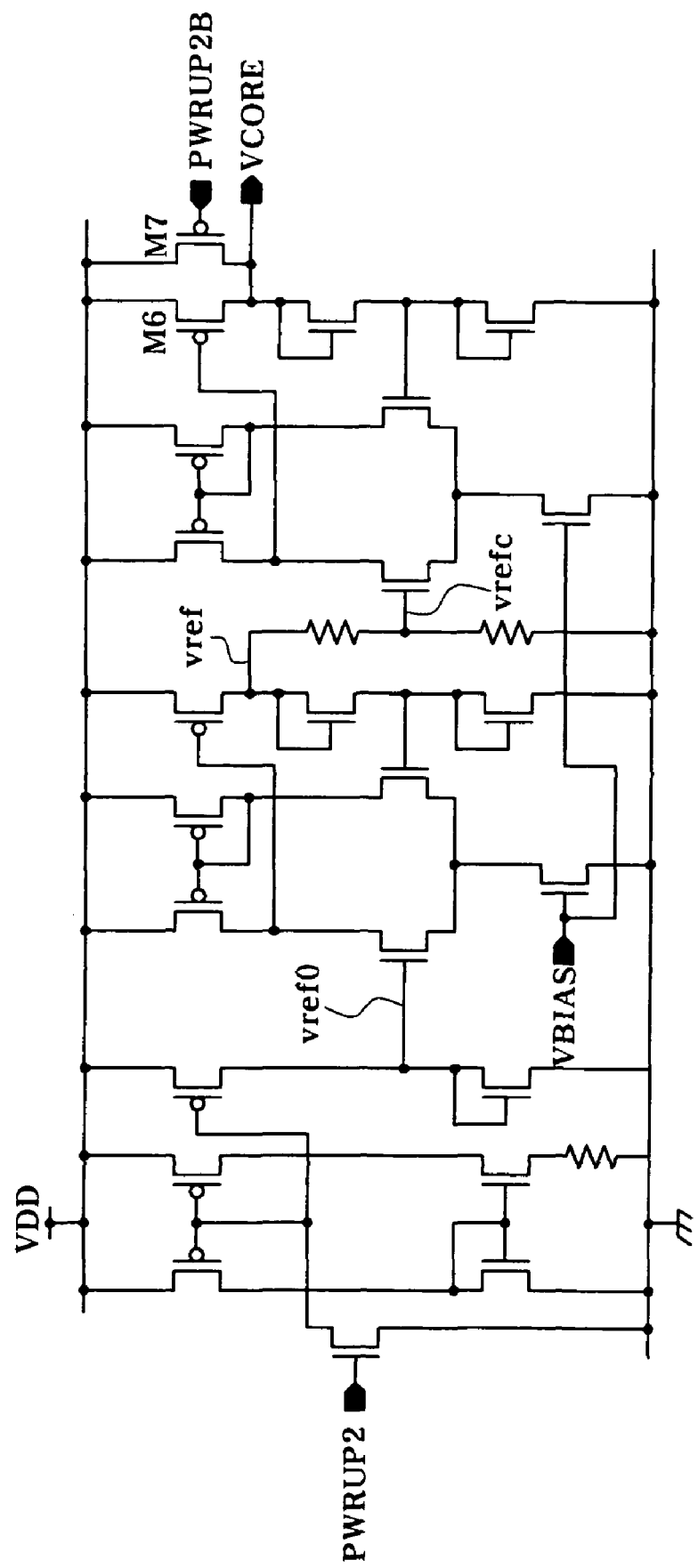
FIG. 4 is a circuit diagram showing an internal voltage generator, particularly, used to explain the operation of the internal voltage generator for the duration of power-up.

FIG. 4 is a circuit diagram showing the internal voltage generator, particularly, a view used to explain operation of the internal voltage generator for the duration of power-up.

As shown in FIG. 4, since the second power-up signal PWRUP2 is high in the internal voltage generator for the duration of power-up, a reference voltage vref0 has a level approximating the level of the power supply voltage VDD, and a reference voltage vref has a level approximating the level of the power supply voltage level VDD.

Thereafter, the voltage level of a transistor M6 is determined by a voltage vrefc obtained by dividing the reference voltage vref so that a core voltage VCORE is driven. At the same time, a transistor M7 shorts the power supply voltage VDD to the core voltage VCORE by using the second power-up signal PWRUP2B, to generate a core voltage.

Then, if the level of the power supply voltage VDD becomes a predetermined level, the second power-up signal PWRUP2 is low, so that the levels of the reference voltages vref0, vref, and vrefc are switched into original target levels, the transistor M7 is turned off.

For example, if the power-up level of the internal voltage generator is set to 1.4 v slightly lower than the level (1.45 v) of the core voltage VCORE on the assumption that the logic module has a power-up level of 1.1 v (this power-up level of 1.1 v may be changed according to conditions), it is possible to prevent problems caused by the weak driving force of the core voltage VCORE under the low power supply voltage. This is adjustable for all internal voltage generators that generate other internal voltages as well as the core voltage VCORE.

As described above, according to this disclosure, the power-up level of the logic module is set differently from the power-up level of the internal voltage generator such that an internal voltage can be generated in a power supply voltage level enabling the internal voltage generator to sufficiently operate. Accordingly, the instability of a power circuit occurring in the initial stage of a power-up operation can be overcome in a mobile product requiring a low power supply voltage.

While the present invention has been described with respect to the particular embodiments, it will be apparent to those skilled in the art that various changes and modifications may be made without departing from the spirit and scope of this disclosure and the following claims.

This disclosure claims priority to Korean application number 10-2008-0024983, filed on Mar. 18, 2008, the entire contents of which are incorporated herein by reference.

What is claimed is:

1. A dual power-up signal generator comprising:
    a power supply voltage level detector configured to output first and second voltage signals obtained by detecting the level of a power supply voltage;
    a first driver configured to drive a first power-up signal in response to the first voltage signal; and
    a second driver configured to drive a second power-up signal in response to the second voltage signal,
    wherein the first driver comprises a first pull-up driver configured to be pull-up driven in response to the first voltage signal, a first resistor configured to be connected in series to the first pull-up driver, and a first pull-down driver configured to be connected to the first resistor in series and to be pull-down driven in response to the first voltage signal.

2. The dual power-up signal generator of claim 1, further comprising a buffer module configured to buffer the first and second power-up signals.

3. The dual power-up signal generator of claim 1, wherein the power supply voltage level detector includes:
    a resistor array configured to divide the power supply voltage to output the second voltage signal; and
    a first NMOS transistor configured to output the first voltage signal in response to the power supply voltage, and be connected between the resistor array and a grounding voltage.

4. The dual power-up signal generator of claim 1, wherein the second driver includes:
    a second pull-up driver configured to be pull-up driven in response to the second voltage signal;
    a second resistor connected in series to the second pull-up driver; and
    a second pull down driver configured to be pull-down driven in response to the second voltage signal.

5. The dual power-up signal generator of claim 1, wherein the first power-up signal is configured for reset of a register of a logic module of a semiconductor memory, and the second power-up signal is configured for control of an internal voltage driver.

6. A dual power-up signal generator comprising:
    a power supply voltage level detector configured to output first and second voltage signals obtained by detecting a level of a power supply voltage;

a first power-up signal driver configured to drive a first power-up signal in response to the first voltage signal;

a second power-up signal driver configured to drive a second power-up signal in response to the second voltage signal, wherein the first power-up signal driver comprises a first pull-up driver configured to be pull-up driven in response to the first voltage signal, a first resistor connected in series to the first pull-up driver, and a first pull-down driver connected in series to the first resistor and configured to be pull-down driven in response to the first voltage signal.

7. The dual power-up signal generator of claim 6, wherein the power supply voltage level detector includes:

a resistor array configured to divide the power supply voltage to output the second voltage signal; and a first NMOS transistor configured to be connect between the resistor array and a ground voltage and, output the first voltage signal in response to the power supply voltage.

8. The dual power-up signal generator of claim 6, further comprising a first buffer module configured to buffer the first power-up signal.

9. The dual power-up signal generator of claim 6, wherein the second power-up signal driver includes:

a second pull-up driver configured to be pull-up driven in response to the second voltage signal;

a second resistor connected in series with the second pull-up driver; and a second pull down driver configured to be pull-down driven in response to the second voltage signal.

10. The dual power-up signal generator of claim 9, further comprising a second buffer module configured to buffer the second power-up signal.

11. The dual power-up signal generator of claim 6, wherein the first power-up signal is configured for reset of a register of a logic module of a semiconductor memory, and the second power-up signal is configured for control of an internal voltage driver.

* * * * *